(12) United States Patent
Son et al.

(10) Patent No.: US 7,826,505 B2
(45) Date of Patent: Nov. 2, 2010

(54) III-V GROUP GAN-BASED COMPOUND SEMICONDUCTOR DEVICE

(75) Inventors: Joong-kon Son, Seoul (KR); Kyoung-ho Ha, Seoul (KR); Han-youl Ryu, Suwon-si (KR)

(73) Assignee: Samsung LED Co., Ltd. (KR)

( * ) Notice: Subject to any disclaimer, the term of this patent is extended or adjusted under 35 U.S.C. 154(b) by 65 days.

(21) Appl. No.: 11/445,220

(22) Filed: Jun. 2, 2006

(65) Prior Publication Data

US 2006/0273300 A1  Dec. 7, 2006

(30) Foreign Application Priority Data

Jun. 3, 2005  (KR) ............... 10-2005-0047999

(51) Int. Cl.
*H01S 5/00* (2006.01)
(52) U.S. Cl. ............... 372/45.012; 372/45.01; 372/43.01
(58) Field of Classification Search ............ 372/45.012, 372/45.01, 46.01, 43.01
See application file for complete search history.

(56) References Cited

U.S. PATENT DOCUMENTS

| | | | | |
|---|---|---|---|---|
| 4,794,611 A | * | 12/1988 | Hara et al. | 372/45.012 |
| 4,882,734 A | * | 11/1989 | Scifres et al. | 372/45.012 |
| 5,670,798 A | * | 9/1997 | Schetzina | 257/96 |
| 6,172,382 B1 | * | 1/2001 | Nagahama et al. | 257/94 |
| 7,015,515 B2 | * | 3/2006 | Taki et al. | 257/103 |

\* cited by examiner

*Primary Examiner*—Minsun Harvey
*Assistant Examiner*—Kinam Park
(74) *Attorney, Agent, or Firm*—Cantor Colburn LLP

(57) ABSTRACT

A III-V Group GaN-based compound semiconductor device with an improved structure having low current comsumption, high optical output, and a long lifetime is provided. The III-V Group GaN-based compound semiconductor device includes an active layer and a first clad layer and a second clad layer, wherein at least one of the first clad layer and the second clad layer has a superlattice structure formed of a plurality of alternating $Al_xGa_{(1-x)}N$ layers ($0<x<1$) and GaN layers, and the composition ratio of aluminum of the $Al_xGa_{(1-x)}N$ layers decreases at a predetermined rate away from the active layer.

10 Claims, 10 Drawing Sheets

1

III-V GROUP GAN-BASED COMPOUND SEMICONDUCTOR DEVICE

CROSS-REFERENCE TO RELATED PATENT APPLICATION

This application claims the benefit of Korean Patent Application No. 10-2005-0047999, filed on Jun. 3, 2005, in the Korean Intellectual Property Office, the disclosure of which is incorporated herein in its entirety by reference.

BACKGROUND OF THE DISCLOSURE

1. Field of the Disclosure

The present disclosure relates to a GaN-based compound semiconductor device, and more in particular, to a III-V Group GaN-based compound semiconductor device with an improved structure having low power consumption, high optical output, and a long lifetime.

2. Description of the Related Art

Compound semiconductor devices such as semiconductor laser diodes capable of converting electrical signals into light by using the characteristics of a compound semiconductor are put to practical use in the application fields such as optical communications, multiple communications, and space communications. Semiconductor lasers are used as light sources for data transmission, data recording or data reading in communication fields such as optical communications or in appliances such as compact disk (CD) players or digital versatile disk (DVD) players.

FIG. 1 is a diagram showing the energy band of a clad layer with a superlattice structure of a conventional GaN laser diode. A clad layer is formed with a superlattice structure to solve the problem of high resistance of an upper p-type clad layer of a conventional GaN-based laser diode. However, the reduction in resistance is limited in a conventional superlattice structure, and thus there is a need to improve the structure to further reduce the resistance.

Referring to FIG. 1, the clad layer includes alternately disposed $Al_xGa_{(1-x)}N$ layers (0<x<1) and GaN layers. The energy level of the $Al_xGa_{(1-x)}N$ layer can be adjusted by controlling the composition ratio of aluminum. Carriers such as electrons and protons injected from an electrode layer pass through the clad layer with a superlattice structure and reach an active layer by tunneling or carrier overflow.

When the composition ratio of aluminum in the clad layer is increased, optical confinement effects are increased and the threshold current can be reduced. However, the resistance due to carrier injection increases, and thus overall the operation voltage increases. Further, as the composition ratio of aluminum increases, the generation of cracks can increase due an increase in strain. In contrast, when the composition ratio of aluminum is decreased, the resistance due to carrier injection decreases and the operation voltage is reduced. However, the optical confinement effects are reduced, and the threshold current thus increases. In other words, to reduce the resistance in the clad layer, the composition ratio of aluminum of the $Al_xGa_{(1-x)}N$ layer must be reduced. However, this causes an increase in the threshold current, and thus a reduction in resistance is limited in a conventional clad layer with a superlattice structure.

SUMMARY OF THE DISCLOSURE

The present invention may provide a III-V Group GaN-based compound semiconductor device with an improved structure having low current comsumption, high optical output, and a long lifetime.

According to an aspect of the present invention, there may be provided a III-V Group GaN-based compound semiconductor device including: an active layer; and a first clad layer and a second clad layer, wherein at least one of the first clad layer and the second clad layer has a superlattice structure formed of a plurality of alternating $Al_xGa_{(1-x)}N$ layers (0<x<1) and GaN layers, and the composition ratio of aluminum of the $Al_xGa_{(1-x)}N$ layers decreases at a predetermined rate away from the active layer.

According to another aspect of the present invention there may be provided a III-V Group GaN-based compound semiconductor device including: an active layer; and a first clad layer and a second clad layer, wherein at least one of the first clad layer and the second clad layer has a superlattice structure formed of a plurality of alternating $Al_xGa_{(1-x)}N$ layers (0<x<1) and $Al_yGa_{(1-y)}N$ layers (0<y<1), and the composition ratios of aluminum of the $Al_xGa_{(1-x)}N$ layers and $Al_yGa_{(1-y)}N$ layers decrease at a predetermined rate away from the active layer.

According to the present invention, the III-V Group GaN-based compound semiconductor device may include a clad layer with a low resistance, and thus obtain low current consumption, high light output, and a long lifetime.

BRIEF DESCRIPTION OF THE DRAWINGS

The above and other features and advantages of the present invention will be described in detailed exemplary embodiments thereof with reference to the attached drawings in which.

DETAILED DESCRIPTION OF PREFERRED EMBODIMENTS

Figure 1:
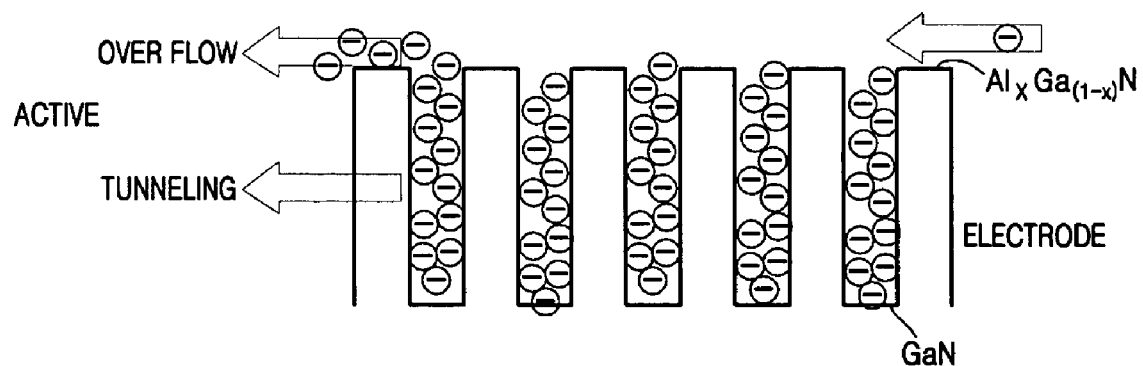
FIG. 1 is a diagram showing the energy band of a clad layer with a superlattice structure of a conventional GaN-based laser diode.

The present invention will now be described more fully with reference to the accompanying drawings, in which exemplary embodiments of the invention are shown. In the drawings, the thicknesses of layers and regions are exaggerated for clarity.

Figure 2:
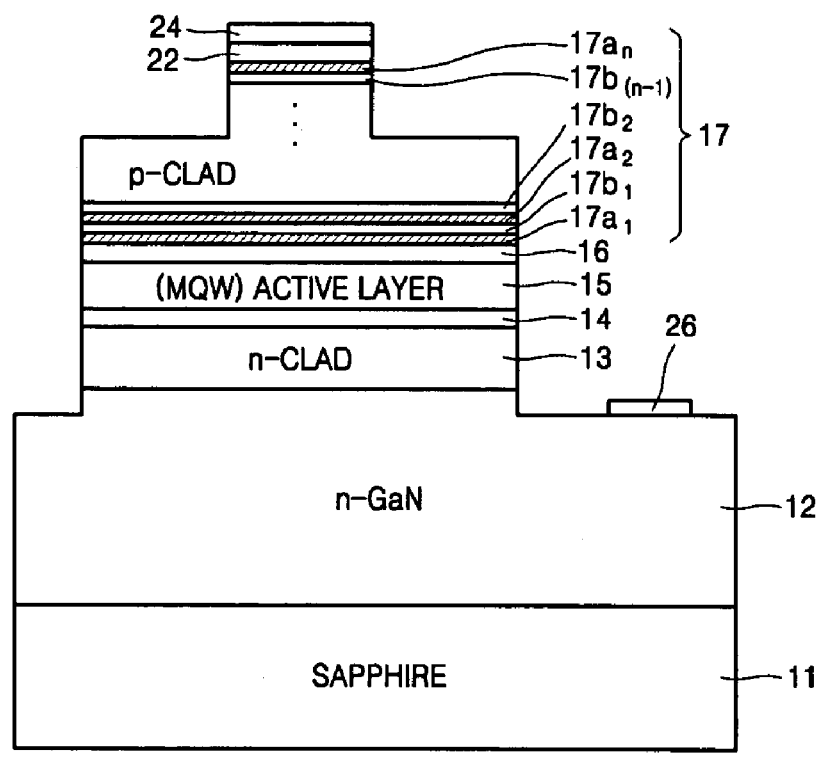
FIG. 2 is a cross-sectional view of a GaN-based laser diode according to an embodiment of the present invention.
Figure 3:
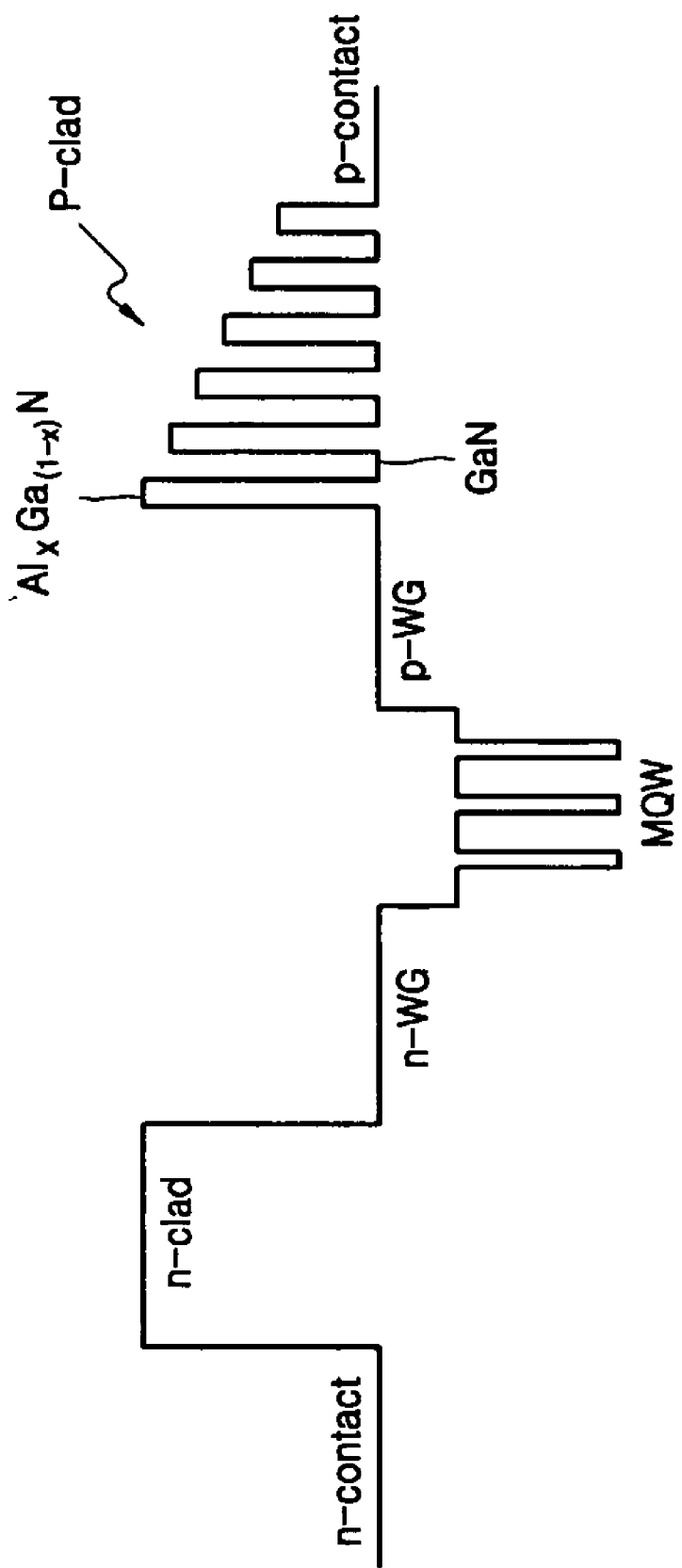
FIG. 3 is a diagram showing the energy band of each layer of the GaN-based laser diode of FIG. 2.

FIG. 2 is a cross-sectional view of a GaN-based laser diode according to an embodiment of the present invention. FIG. 3 is a diagram showing the energy band of each layer of the GaN-based laser diode of FIG. 2.

Referring to FIG. 2, the GaN-based laser diode according to an embodiment of the present invention includes a sapphire substrate 11, and a lower n-GaN contact layer 12, an n-clad layer 13, an n-optical waveguide layer 14, an active layer 15, a p-optical waveguide layer 16 and a p-clad layer 17 stacked sequentially. The p-clad layer 17 is formed with a ridge structure, and a p-contact layer 22 and a p-electrode 24 are sequentially formed on the ridge. Also, an n-electrode 26 corresponding to the p-electrode 24 is provided on a nozzle surface of the lower n-GaN contact layer 12. The p-clad layer 17 has a superlattice structure formed of alternately stacked $Al_xGa_{(1-x)}N$ layers $17a_1, 17a_2, \ldots, 17a_n$ (0<x<1) and GaN layers $17b_1, 17b_2, \ldots, 17b_{(n-1)}$. The composition ratios of aluminum in the $Al_xGa_{(1-x)}N$ layers $17a_1, 17a_2, \ldots, 17a_n$ (0<x<1) decrease at a predetermined rate as the distance from the active layer 15 increases. Referring to FIG. 3, according to the present invention, as the composition rate of aluminum of the $Al_xGa_{(1-x)}N$ layer $17a_1, 17a_2, \ldots, 17a_n$ decreases, the energy level of the $Al_xGa_{(1-x)}N$ layers $17a_1, 17a_2, \ldots, 17a_n$ lowers correspondingly.

Accordingly, in a III-V Group GaN-based compound semiconductor device, the optical confinement effect can be effectively maintained at the $Al_xGa_{(1-x)}N$ layer $17a_1$ adjacent to the active layer 15. The resistance in carrier injection can be reduced at the $Al_xGa_{(1-x)}N$ layer $17a_n$, compared to a conventional semiconductor device.

Now, resistance reduction in the resistance in the carrier injection will be described in detail. Carriers as electrons or protons injected from an electrode layer can pass through the clad layer of a superlattice structure and reach an active layer by the method of tunnelling or carrier overflow. It is known that the tunnelling current increases linearly with respect to external voltage, but the overflow current increases exponentially. In particular, high output laser diodes require high injection current. Thus, the overflow current $I_o$ plays a more important role than the tunnelling current $I_t$ in a clad layer with a superlattice structure. According to the present invention, a GaN-based compound semiconductor device is advantageous to carrier injection, and the resistance in carrier injection thereby can be reduced.

Also, since the energy level at the $Al_xGa_{(1-x)}N$ layer $17a_n$ adjacent to p-electrode 24 is low in the GaN-based compound semiconductor device, the number of the protons trapped in the p-clad layer 17 can be reduced, and the threshold current of the device can be reduced as well.

Figure 4:
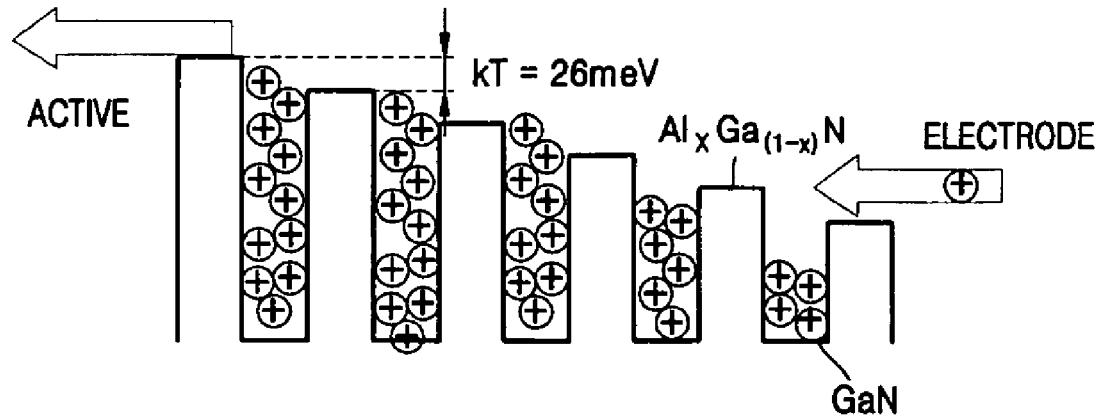
FIG. 4 illustrates carrier transportation by tunneling and by carrier overflow of a p-clad layer of FIG. 3.

FIG. 4 illustrates carrier transportation in a p-clad layer structure by tunnelling and carrier overflow. Carriers, as electrons or protons injected from an electrode layer, can pass through the clad layer with a superlattice structure and reach an active layer by the method of tunnelling or carrier overflow. FIG. 4 shows that the number of the electrons trapped in the p-clad layer 17 can be reduced. Thus, the threshold current of the compound semiconductor device can be reduced according to the present invention.

For easier carrier injection to the active layer 15, the difference between the energy levels of an adjacent pair of the $Al_xGa_{(1-x)}N$ layers $17a$ may be 37 meV or less equal to the sum of 26 meV, the difference in the energy levels in the conduction band of the pair the $Al_xGa_{(1-x)}N$ layers $17a$, and 11 meV, the difference of the energy levels in the valence band of the pair of the $Al_xGa_{(1-x)}N$ layers $17a$. The difference of 37 meV corresponds to 1.3%, which is the rate of decrease of the composition ratio of aluminum in the $Al_xGa_{(1-x)}N$ layers $17a_1, 17a_2, \ldots, 17a_n$. Thus, the rate of decrease of the composition ratio of aluminum of the difference between the energy levels of a pair of the $Al_xGa_{(1-x)}N$ layers $17a$ may be 1.3% or less.

Also, when the composition rate of aluminum is low, the $Al_xGa_{(1-x)}N$ layers $17a$ can be easily doped with impurities. Accordingly, when the composition ratios of aluminum of the $Al_xGa_{(1-x)}N$ layers $17a$ are predetermined low values, the $Al_xGa_{(1-x)}N$ layers $17a$ may be doped with p-type or n-type impurities. The same applies to any $Al_yGa_{(1-y)}$ layers. Also, the GaN layers $17b$ can be doped with p-type or n-type impurities.

The clad layer has a structure that allows a reduction in resistance, thus reducing the operating current. As the operating current is reduced, a GaN-based compound semiconductor device has a structure of reduced thermal loss, an increased lifetime and high output are provided. The GaN-based compound semiconductor device according to the present embodiment has superior compound semiconductor device characteristics when compared to a conventional compound semiconductor device.

Figure 5:
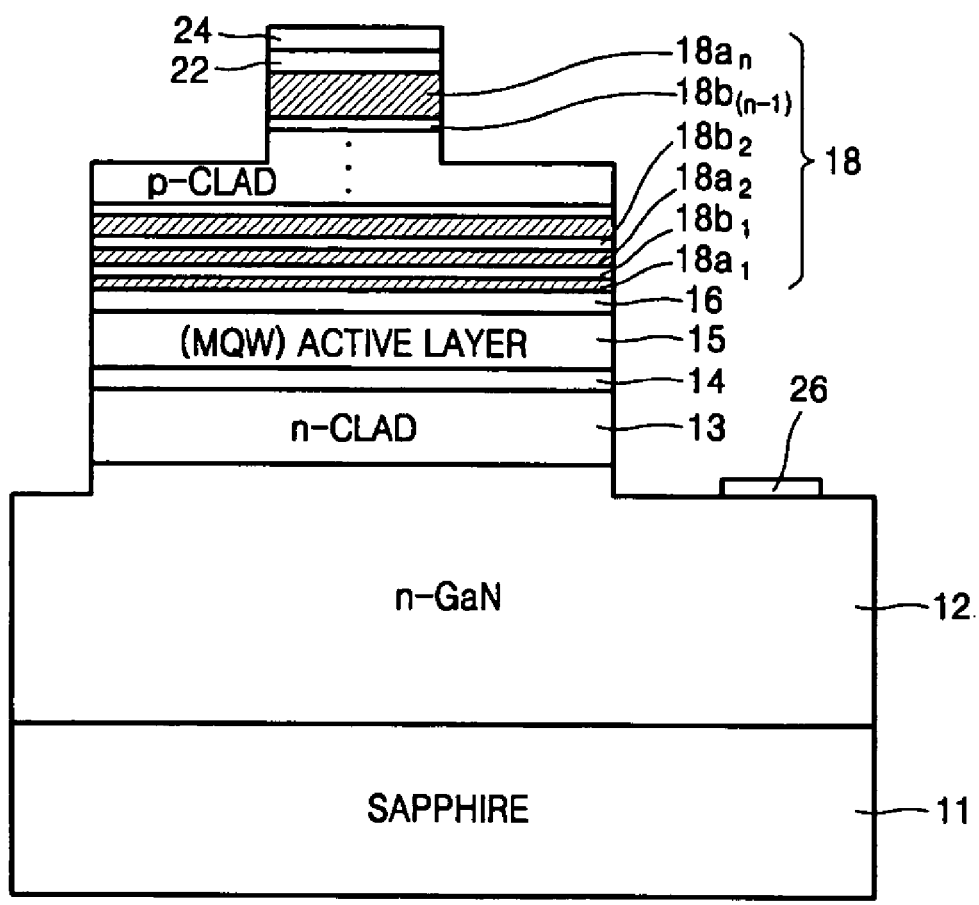
FIG. 5 is a cross-sectional view of a GaN-based laser diode according to an embodiment of the present invention.
Figure 6:
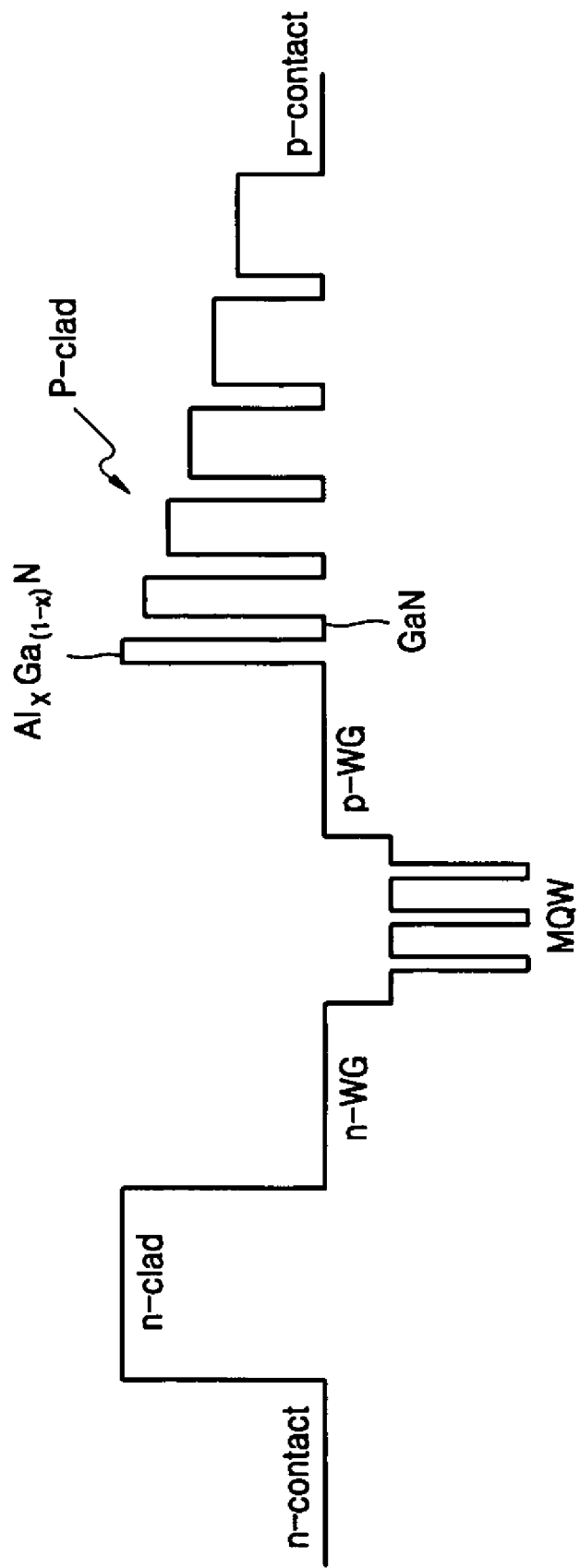
FIG. 6 is a diagram showing the energy band of each layer of the GaN-based laser diode of FIG. 5.

FIG. 5 is a cross-sectional view of a GaN-based laser diode according to an embodiment of the present invention. FIG. 6 is a diagram of the energy band of each layer of the GaN-based laser diode according to the embodiment shown in FIG. 5. Like reference numerals in the drawings denote like elements, and thus their description will not be repeated.

In a GaN-based laser diode according to the embodiment of FIG. 5, a p-clad layer 18 has a superlattice structure formed of an $Al_xGa_{(1-x)}N$ layers $18a_1, 18a_2, \ldots, 18a_n$ (0<x<1) and a GaN layers $18b_1, 18b_2, \ldots, 18b_{(n-1)}$, alternately and repeatedly. It is the same with the embodiment of FIG. 2 in that the composition rate of aluminum of the $Al_xGa_{(1-x)}N$ layers $18a_1, 18a_2, \ldots, 18a_n$ gradually decreases the farther from the active layer 15. It varies from the embodiment of FIG. 2 since the thickness of the $Al_xGa_{(1-x)}N$ layer $18a_1, 18a_2, \ldots, 18a_n$ increases the farther from the active layer 15. As the thickness of the $Al_xGa_{(1-x)}N$ layers $18a_1, 18a_2, \ldots 18a_n$ increases, they can be easily doped with p-type or n-type impurities, and thus the resistance of the p-clad layer 18 can be reduced.

Figure 7:
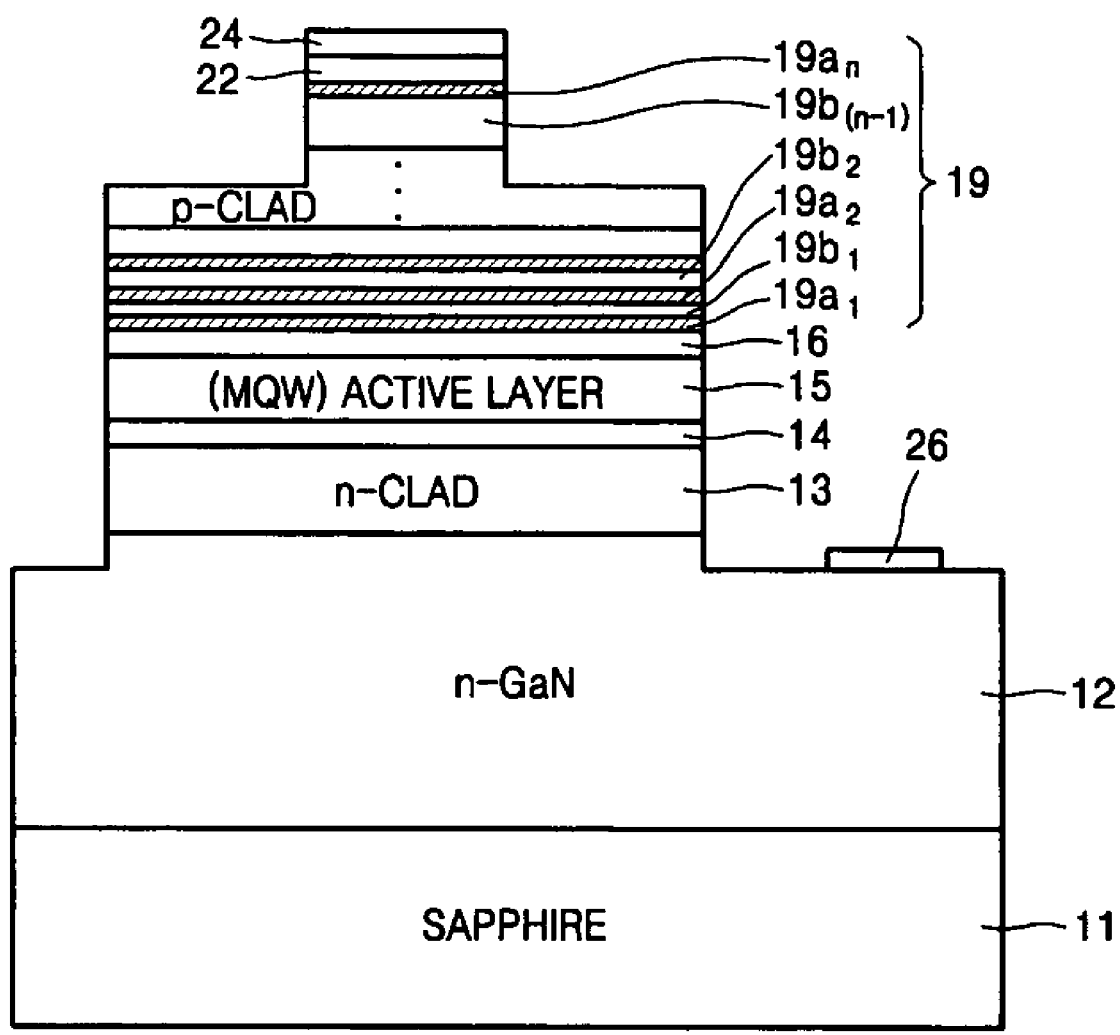
FIG. 7 is a cross-sectional view of a GaN-based laser diode according to an embodiment of the present invention.
Figure 8:
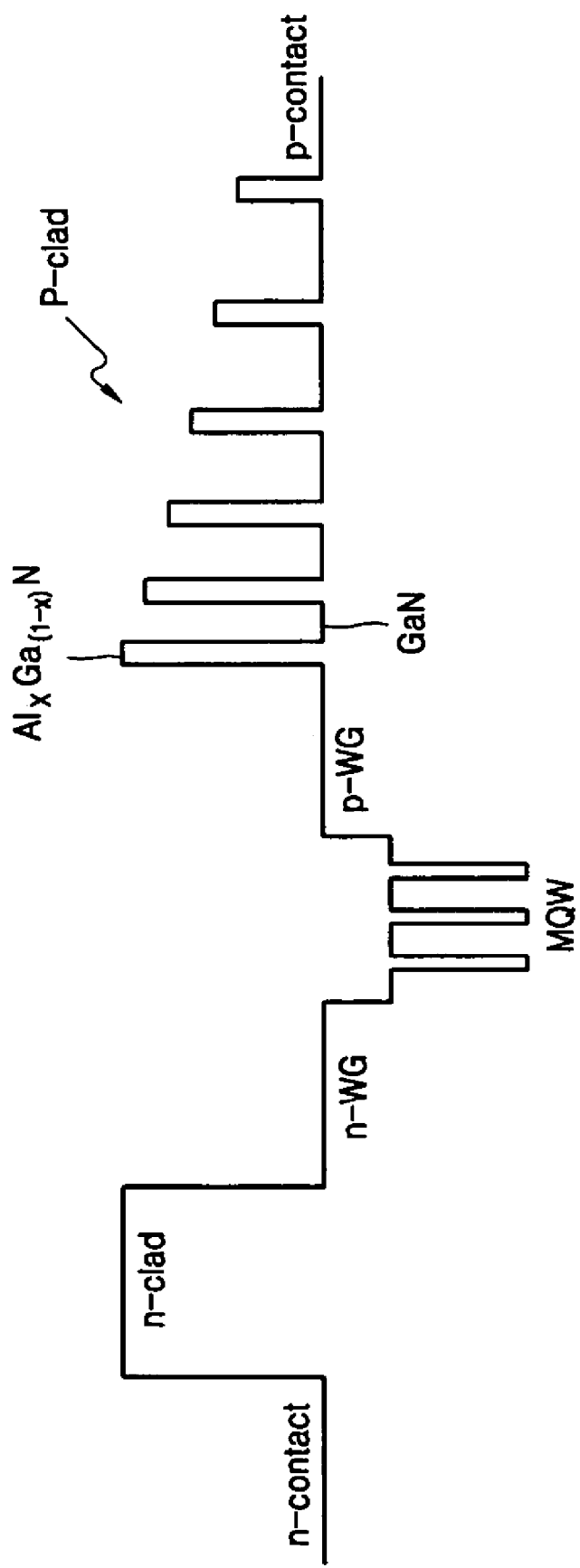
FIG. 8 is a diagram showing the energy band of each layer of the GaN-based laser diode of FIG. 7.

FIG. 7 is a cross-sectional view of a GaN-based laser diode according to an embodiment of the present invention. FIG. 8 is a diagram of the energy band of each layer of the GaN-based laser diode of FIG. 7. Like reference numerals in the drawings denote like elements, and thus their description will not be repeated.

In the GaN-based laser diode according to the present embodiment, a p-clad layer 19 has a superlattice structure formed of alternately stacked $Al_xGa_{(1-x)}N$ layers $19a_1, 19a_2, \ldots, 19a_n$ (0<x<1) and GaN layers $19b_1, 19b_2, \ldots 19b_{(n-1)}$. Similarly to the embodiment of FIG. 2, the composition ratios of aluminum of the $Al_xGa_{(1-x)}N$ layer $19a_1, 19a_2, \ldots, 19a_n$ gradually decrease away from the active layer 15. However, when compared to the embodiment of FIG. 2, the thicknesses of GaN layers $19b_1, 19b_2, \ldots 19b_{(n-1)}$ increase away from the active layer 15. As the thicknesses of the GaN layers $19b_1, 19b_2, \ldots 19b_{(n-1)}$ increase, they can be easily doped with p-type or n-type impurities, and thus the resistance of the p-clad layer 18 can be reduced.

Figure 9:
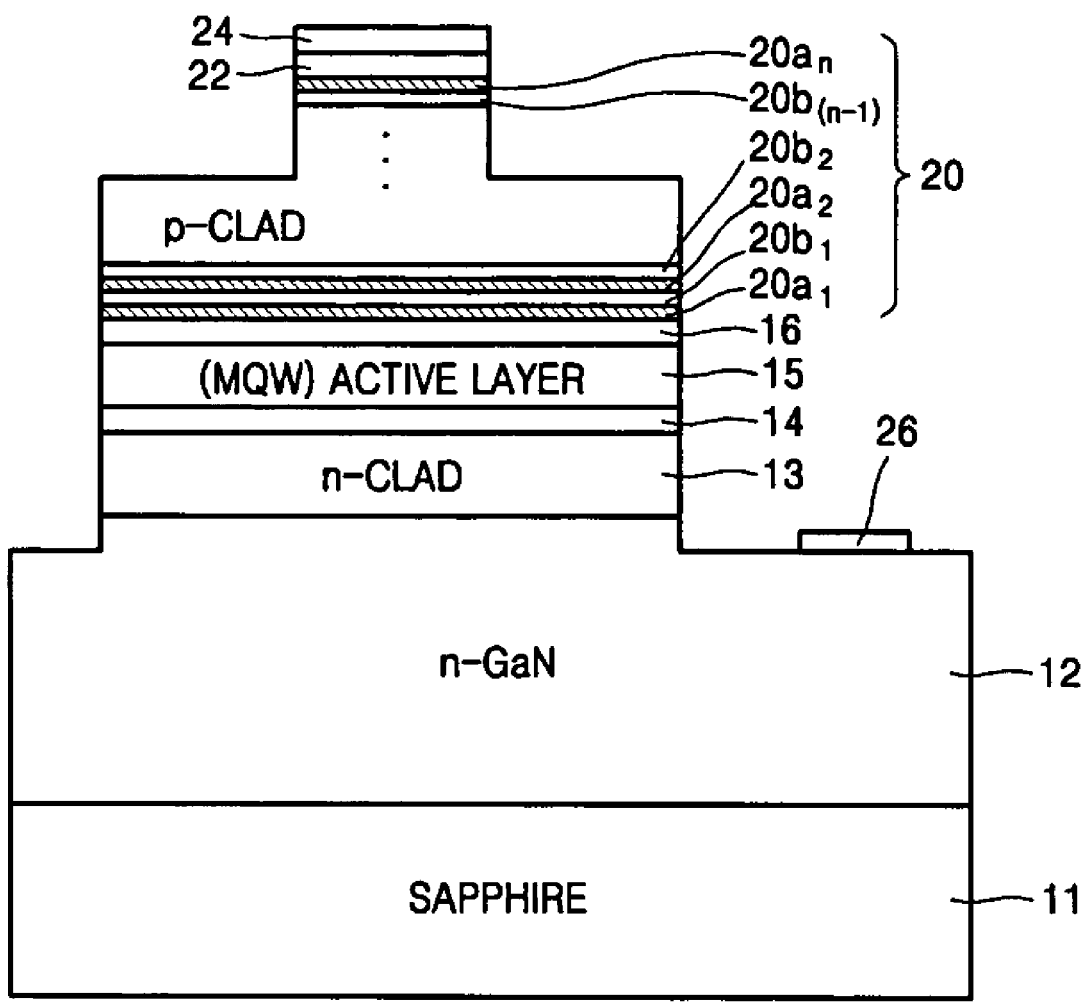
FIG. 9 is a cross-sectional view of a GaN-based laser diode according to an embodiment of the present invention.
Figure 10:
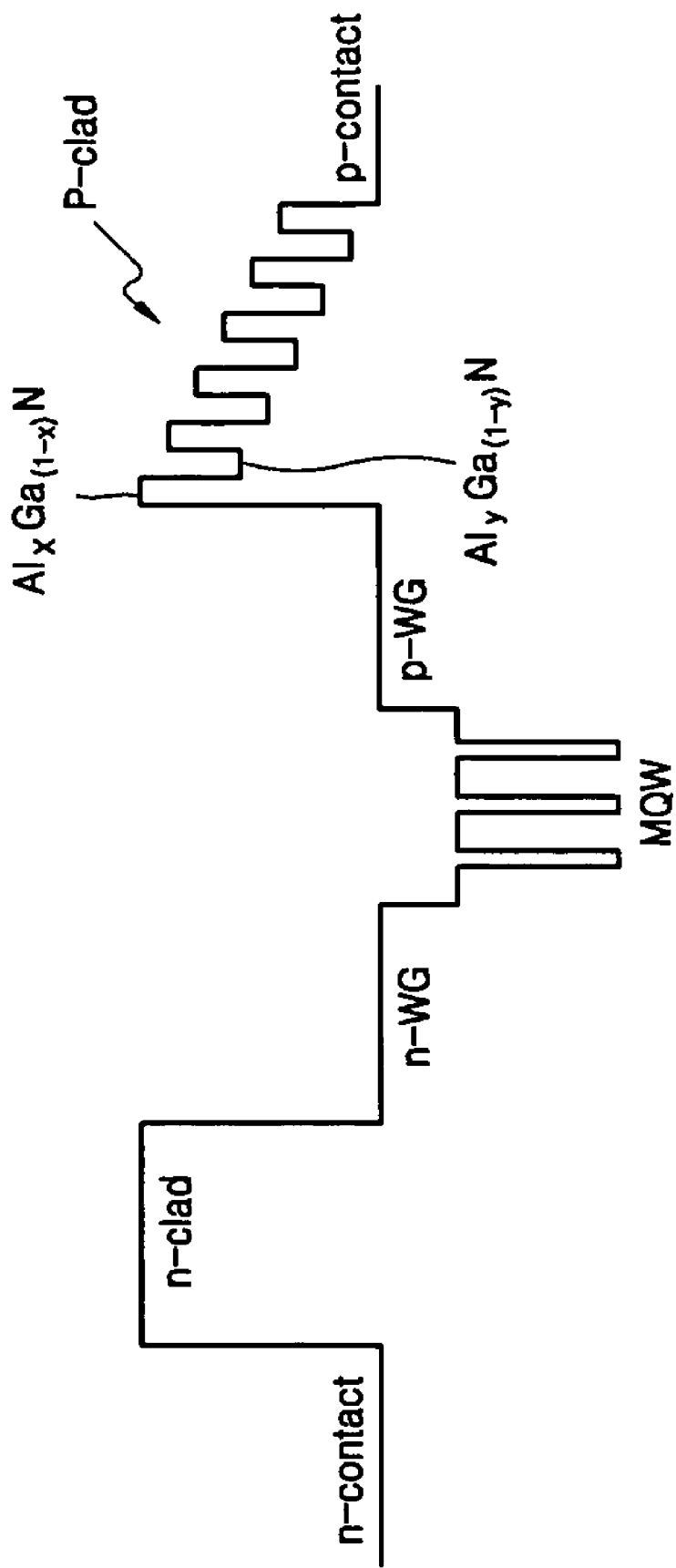
FIG. 10 is a diagram of the energy band of each layer of the GaN-based laser diode of FIG. 9.

FIG. 9 is a cross-sectional view of a GaN-based laser diode according an embodiment of the present invention. FIG. 10 is a diagram of the energy band of each layer of the GaN-based laser diode of FIG. 9. Like reference numerals in the drawings denote like elements, and thus their description will not be repeated.

In the GaN-based laser diode according to the embodiment of FIG. 9, a p-clad layer 20 has a superlattice structure formed of alternately stacked $Al_xGa_{(1-x)}N$ layers $20a_1, 20a_2, \ldots, 20a_n$ ($0<x<1$) and $Al_yGa_{(1-y)}N$ layer $20b_1, 20b_2, \ldots, 20b_{(n-1)}$ ($0<x<1$) As compared to the embodiment of FIG. 2, in which the energy levels of the GaN layers $17b_1, 17b_2, \ldots, 17b_{(n-1)}$ are equal, and the energy levels of the $Al_xGa_{(1-x)}N$ layer $17a_1, 17a_2, \ldots, 17a_n$ gradually decrease, the energy levels of both the $Al_xGa_{(1-x)}N$ layers $20a_1, 20a_2, \ldots 20a_n$ and the energy levels of the $Al_yGa_{(1-y)}N$ layers $20b_1, 20b_2, \ldots, 20b_{(n-1)}$ gradually decrease in the embodiment of FIG. 9. Referring to the energy band diagram of FIG. 10 in the GaN-based lader diode, according to the embodiment of the present invention illustrated in FIG. 9, more protons trapped in the p-clad layer 20 are reduced than in the embodiment of FIG. 2. Accordingly, the operating current of the present embodiment is reduced.

COMPARATIVE EXAMPLE

A conventional GaN-based diode including a clad layer with a superlattice structure was provided. A p-clad layer was formed of 100 $Al_{0.1}Ga_{(0.9)}N$ layer-GaN layer pairs. Each layer was formed to a thickness of 25 Å, and the current-voltage characteristic (I-V) and the full width of half maximum (FWHM) characteristic of the laser diodes were measured.

EXAMPLE

The GaN-based laser diode according to the embodiment of FIG. 2 was formed. The p-clad layer was formed of 10 $Al_{0.1}Ga_{0.9}N$ layer-GaN layer pairs, 10 $Al_{0.09}Ga_{0.91}N$ layer-GaN layer pairs, 10 $Al_{0.08}Ga_{0.92}N$ layer-GaN layer pairs, 10 $Al_{0.07}Ga_{0.93}N$ layer-GaN layer pairs, . . . , and 10 $Al_{0.01}Ga_{0.99}N$ layer-GaN layer pairs stacked sequentially. Each of the layers had a thickness of 25 Å, and the values of the current-voltage characteristic (I-V) and the full width of half maximums (FWHM) of the laser diodes were measured.

The data obtained from the laser diodes provided in the comparative example and in the example, are compared in Table 1. Table 1 shows the results of the measurement of the threshold current ($I_{th}$), the slope efficiency (S.E.), the resistance (R), the operating current ($P_{op}$), the optical confinement factor (O.C.F) and the aspect ratio (A.R).

and the operating current can be reduced. Because of the reduction in operating current, the GaN-based compound semiconductor device has reduced thermal loss, an increased lifetime, and high output. Thus, the GaN-based compound semiconductor device according to the present invention has superior properties when compared to a conventional compound semiconductor device.

The III-V Group GaN-based compound semiconductor device according to the present invention can be applied in the industrial field of light emitting devices such as laser diodes (LD).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A III-V Group GaN-based compound semiconductor device comprising:
    an active layer; and
    a first clad layer and a second clad layer,
    wherein at least one of the first clad layer and the second clad layer has a superlattice structure formed of a plurality of alternating AlxGa(1-x)N layers ($0<x<1$) and GaN layers, and the composition ratio of aluminum of the AlxGa(1-x)N layers decreases at a predetermined rate according to an increase in the distance of the AlxGa(1-x) N layers away from the active layer, and each of the AlxGa(1-x)N layers has a uniform aluminum concentration throughout the layer,
    wherein an energy level of a conduction band edge of the AlxGa(1-x)N layer closest to the active layer is the highest among the AlxGa(1-x)N layers, and an energy level of a conduction band edge of the AlxGa(1-x)N layer farthest from the active layer is the lowest among the AlxGa(1-x)N layers, and
    wherein the composition ratio of aluminum in the AlxGa (1-x)N layers decreases at a rate of 1.3% or less.

2. The III-V Group GaN-based compound semiconductor device of claim 1, wherein, the composition ratios of aluminum of the AlxGa(1-x)N layers decreases gradually at a pre-

TABLE 1

| | $I_{th}$ | S.E. | R (Ohm) (@50 mA) | $P_{op}$(45 mW) | $P_{op}$(90 mW) | O.C.F. | A.R. |
|---|---|---|---|---|---|---|---|
| Uniform clad | 29.2 mA | 1.02 | 26.9 | 380 mW (73.6 mA @ 5.16 V) | 703 mW (113.0 mA @ 6.22 V) | 4.03% | 3.0 |
| Graded clad | 29.4 mA | 1.06 | 20.6 | 345 mW (73.3 mA @ 4.71 V) | 622 mW (112.6 mA @ 5.52 V) | 3.99% | 2.85 |

Figure 11A:
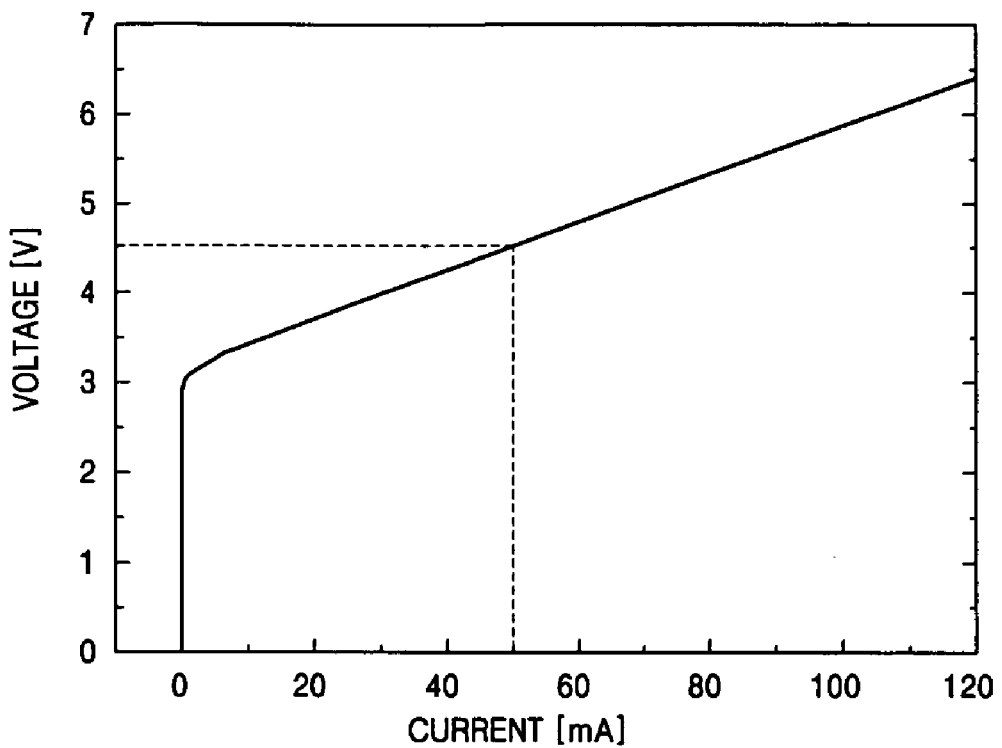
FIGS. 11A and 11B show the current-voltage characteristic (I-V) of the laser diodes constructed in a comparative example and in an example, respectively.
Figure 11B:
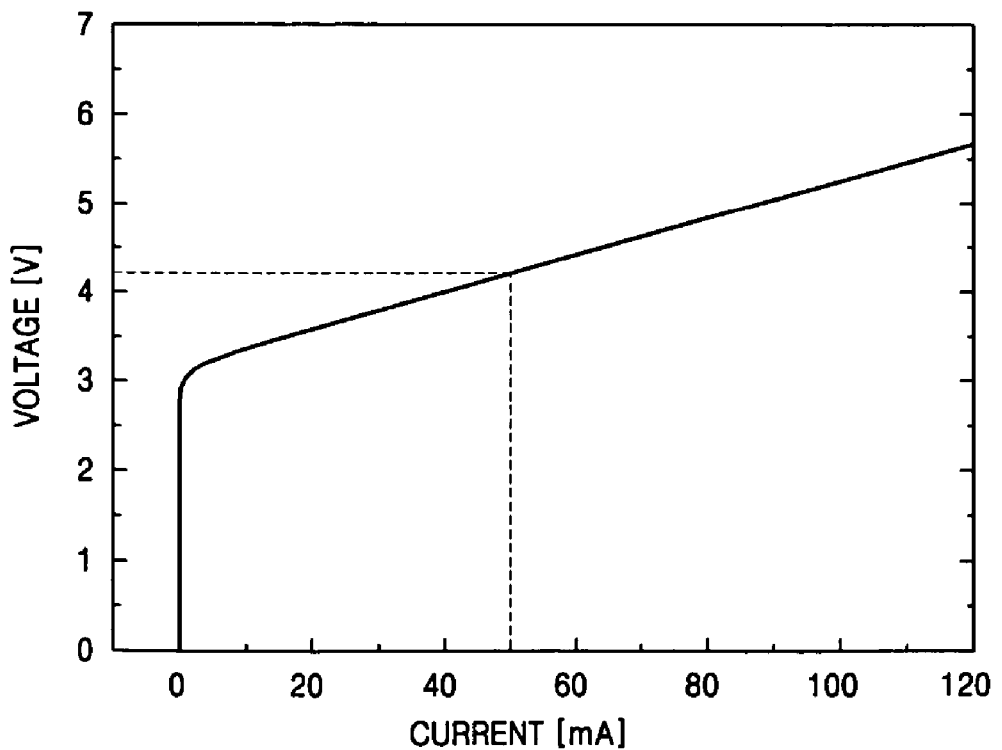

FIGS. 11A and 11B show the current-voltage characteristic (I-V) of the laser diodes constructed in the comparative example and in the example, respectively.

Figure 12A:
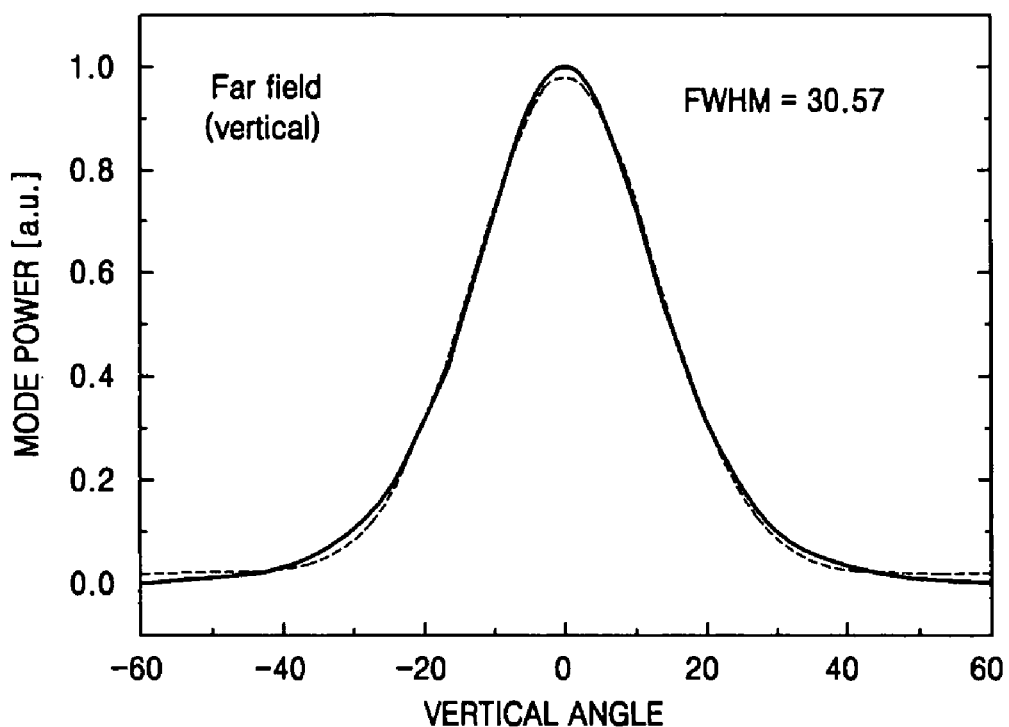
FIGS. 12A and 12B show the full width of half maximums (FWHM) of the laser diodes constructed in the comparative example and the example, respectively.
Figure 12B:
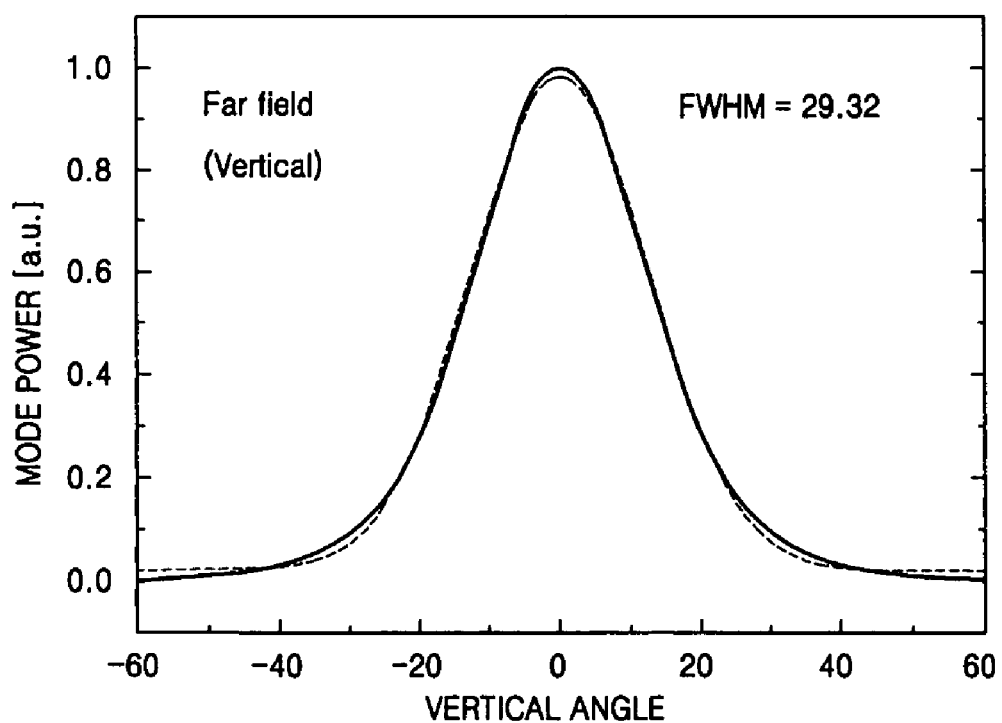

FIGS. 12A and 12B show the full width of half maximums (FWHM) of the laser diodes constructed in the comparative example and in the embodiment, respectively.

According to the present invention, a III-V Group GaN-based compound semiconductor device has a clad layer with a low resistance. In particular, in the III-V Group GaN-based compound semiconductor device of the present invention, the optical confinement effect is maintained and the resistance determined rate away from the active layer and the thicknesses of the AlxGa(1-x)N layer increases gradually away from the active layer.

3. The III-V Group GaN-based compound semiconductor device of claim 1, wherein the composition ratios of aluminum of the AlxGa(1-x)N layers decreases gradually at a predetermined rate away from the active layer and the thicknesses of the GaN layers gradually increases away from the active layer.

4. The III-V Group GaN-based compound semiconductor device of claim 1, wherein the composition ratios of aluminum of the AlxGa(1-x)N layers are a predetermined value or less, and the AlxGa(1-x)N layer is doped with p-type or n-type impurities.

5. The III-V Group GaN-based compound semiconductor device of claim 1, wherein the AlxGa(1-x)N layer is doped with p-type or n-type impurities.

6. A III-V Group GaN-based compound semiconductor device comprising:
   an active layer; and
   a first clad layer and a second clad layer,
   wherein at least one of the first clad layer and the second clad layer has a superlattice structure formed of a plurality of alternating AlxGa(1-x)N layers (0<x<1) and AlyGa(1-y)N layers (0<y<1), and, the composition ratios of aluminum of the AlxGa(1-x)N layers and AlyGa(1-y)N layers decrease at a predetermined rate according to an increase in the distance of the AlxGa(1-x)N layers and AlyGa(1-y)N layers away from the active layer, and each of the AlxGa(1-x)N layers has a uniform aluminum concentration throughout the layer,
   wherein an energy level of a conduction band edge of the AlxGa(1-x)N layer closest to the active layer is the highest among the AlxGa(1-x)N layers, and an energy level of a conduction band edge of the AlxGa(1-x)N layer farthest from the active layer is the lowest among the AlxGa(1-x)N layers, and
   wherein the composition ratio of aluminum in the AlxGa(1-x)N layers decreases at a rate of 1.3% or less.

7. The III-V Group GaN-based compound semiconductor device of claim 6, wherein the composition ratios of aluminum of the AlxGa(1-x)N layers and the AlyGa(1-y)N layers decrease gradually at a predetermined rate away from the active layer, and the thicknesses of the AlxGa(1-x)N layers increase gradually away from the active layer.

8. The III-V Group GaN-based compound semiconductor device of claim 6, wherein, the composition ratios of aluminum of the AlxGa(1-x)N layers and the AlyGa(1-y)N layers decreases gradually at a predetermined rate away from the active layer, and the thicknesses of the AlyGa(1-y)N layers increase gradually away from the active layer.

9. The III-V Group GaN-based compound semiconductor device of claim 6, wherein the composition ratios of aluminum of the AlxGa(1-x)N layers are a predetermined value or less, and the AlxGa(1-x)N layer is doped with p-type or n-type impurities.

10. The III-V Group GaN-based compound semiconductor device of claim 6, wherein the composition ratios of aluminum of the AlyGa(1-y)N layers are a predetermined value or less, and the AlyGa(1-y)N layer is doped with p-type or n-type impurities.

* * * * *